(12) United States Patent
Lee et al.

(10) Patent No.: US 11,842,784 B2
(45) Date of Patent: Dec. 12, 2023

(54) SEMICONDUCTOR DEVICES AND SEMICONDUCTOR SYSTEMS FOR PERFORMING TEST

(71) Applicant: SK hynix Inc., Icheon-si (KR)

(72) Inventors: Seung Woo Lee, Icheon-si (KR); Dong Hee Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/548,242

(22) Filed: Dec. 10, 2021

(65) Prior Publication Data

US 2023/0093321 A1 Mar. 23, 2023

(30) Foreign Application Priority Data

Sep. 17, 2021 (KR) .................. 10-2021-0124926

(51) Int. Cl.
*G11C 7/00* (2006.01)
*G11C 29/50* (2006.01)
*G11C 11/4076* (2006.01)
*G11C 11/16* (2006.01)
*G11C 7/24* (2006.01)

(52) U.S. Cl.
CPC .............. *G11C 29/50* (2013.01); *G11C 7/24* (2013.01); *G11C 11/1675* (2013.01); *G11C 11/4076* (2013.01)

(58) Field of Classification Search
CPC ................................................ G11C 29/50
See application file for complete search history.

(56) References Cited

U.S. PATENT DOCUMENTS

| 8,274,841 | B2 | 9/2012 | Shimano et al. | |
| 2008/0144363 | A1* | 6/2008 | Lee ........................ | G11C 29/08 365/201 |
| 2010/0034037 | A1* | 2/2010 | Tabata ............. | G11C 29/56004 365/201 |
| 2011/0063931 | A1* | 3/2011 | Linam ................. | G06F 13/1689 365/189.08 |
| 2012/0026809 | A1* | 2/2012 | Yang ....................... | G11C 29/28 365/194 |

FOREIGN PATENT DOCUMENTS

KR 1020130015939 A 2/2013

* cited by examiner

*Primary Examiner* — Min Huang
(74) *Attorney, Agent, or Firm* — WILLIAM PARK & ASSOCIATES LTD.

(57) ABSTRACT

A semiconductor device includes a test command generation circuit that generates a test write command and a test read command when entering a test mode, and an input/output control circuit that controls a memory block, the memory block including a plurality of banks such that write operations are simultaneously performed on the plurality of banks based on the test write command and read operations are simultaneously performed on the plurality of banks based on the test read command.

14 Claims, 17 Drawing Sheets

SEMICONDUCTOR DEVICES AND SEMICONDUCTOR SYSTEMS FOR PERFORMING TEST

CROSS-REFERENCE TO RELATED APPLICATIONS

The present application claims priority under 35 U.S.C. 119(a) to Korean Patent Application No. 10-2021-0124926, filed on Sep. 17, 2021, which is incorporated herein by reference in its entirety.

BACKGROUND

1. Technical Field

Embodiments of the present disclosure relate to semiconductor devices and semiconductor systems for performing tests.

2. Related Art

In general, a semiconductor device may perform various internal operations including a write operation, a read operation, or the like. The semiconductor device may receive data and store the data in a memory block when a write operation is performed, and may output the data stored in the memory block when a read operation is performed. Because reliability of the semiconductor device cannot be secured when there is an error in internal operations performed in the semiconductor device, tests for determining whether various internal operations are normally performed are provided to the semiconductor device.

SUMMARY

According to an embodiment of the present invention, there is provided a semiconductor device including a test command generation circuit that generates a test write command and a test read command when entering a test mode; and an input/output control circuit that controls a memory block, the memory block including a plurality of banks such that write operations are simultaneously performed on the plurality of banks based on the test write command and read operations are simultaneously performed on the plurality of banks based on the test read command.

In addition, according to another embodiment of the present invention, there is provided a semiconductor system including a controller that outputs an external control signal and input data and receives output data; and a semiconductor device that simultaneously performs write operations on a plurality of banks in a test mode that is entered based on the external control signal and applies output data, generated by simultaneously performing read operations on the plurality of banks in the test mode, to the controller.

DETAILED DESCRIPTION OF THE EMBODIMENTS

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal with a logic "high" level may be distinguished from a signal with a logic "low" level. For example, when a signal with a first voltage correspond to a signal with a logic "high" level, a signal with a second voltage correspond to a signal with a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal with a logic "high" level in one embodiment may be set to have a logic "low" level in another embodiment.

"Logic bit set" may mean a combination of logic levels of bits included in a signal. When the logic level of each of the bits included in the signal is changed, the logic bit set of the signal may be set differently. For example, when the signal includes two bits and the logic level of each of the two bits included in the signal is logic "low" level and logic "low" level, the logic bit set of the signal may be set as a first logic bit set, and when the logic level of each of the two bits included in the signal is a logic "low" level and a logic "high" level, the logic bit set of the signal may be set as a second logic bit set.

Various embodiments of the present disclosure will be described hereinafter in detail with reference to the accompanying drawings. However, the embodiments described herein are for illustrative purposes only and are not intended to limit the scope of the present disclosure.

Figure 1:
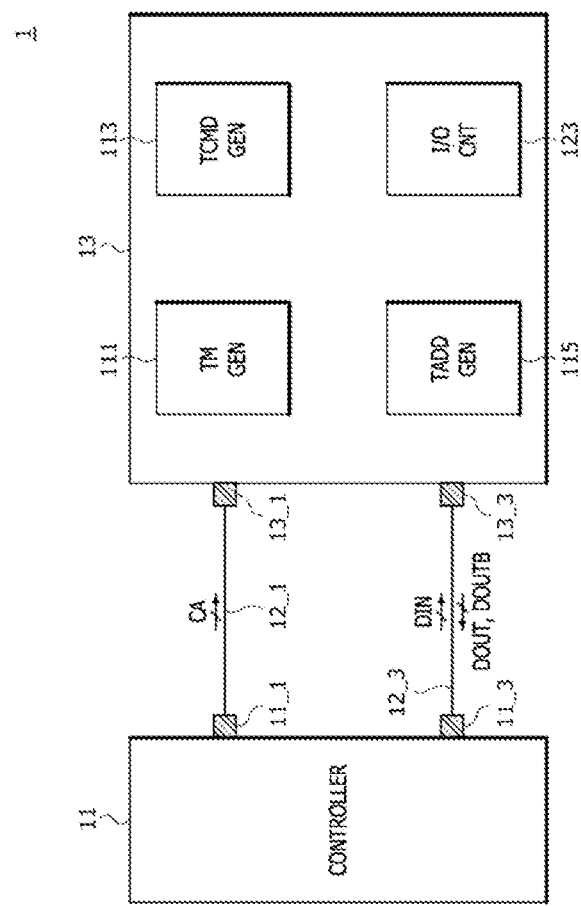
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As illustrated in FIG. 1, the semiconductor system 1 may include a controller 11 and a semiconductor device 13.

The controller 11 may include a first control pin 11_1 and a second control pin 11_3. The semiconductor device 13 may include a first device pin 13_1 and a second device pin 13_3. The controller 11 may transmit an external control signal CA to the semiconductor device 13 through a first transmission line 12_1 that is connected between the first control pin 11_1 and the first device pin 13_1. In the present embodiment, the external control signal CA may include a command and an address, but this is only an example and the present disclosure is not limited thereto. The combination of first control pin 11_1, first transmission line 12_1, and first device pin 13_1 may be a set to transmit an external control signal CA. There may be one or more sets that are implemented based on the number of bits of the external control signal CA. The controller 11 may transmit input data DIN to the semiconductor device 13 through a second transmission line 12_3 that is connected between the second control pin 11_3 and the second device pin 13_3. The controller 11 may receive output data DOUT and inverted output data DOUTB through the second transmission line 12_3 that is connected between the second control pin 11_3 and the second device pin 13_3. Similar to the combination of first control pin 11_1, first transmission line 12_1, and first device pin 13_1, the implementation of the combination of second control pin 11_3, second transmission line 12_3, second device pin 13_3 may vary based on the number of bits of data being transmitted.

The semiconductor device 13 may include a test mode signal generation circuit (TM GEN) 111 that generates a first test mode signal TM1 (FIG. 2) for entering a first test mode and a second test mode signal TM2 (FIG. 2) for entering a second test mode based on the external control signal CA. The semiconductor device 13 may include a test command generation circuit (TCMD GEN) 113 that generates a test write command TW_C (FIG. 2) and a test read command TR_C (FIG. 2) that are sequentially activated to sequentially perform a write operation and a read operation on a plurality of banks BK1 and BK2 (FIG. 3) when entering the second test mode. The semiconductor device 13 may include a test address generation circuit (TADD GEN) 115 that generates a test memory block address TMB (FIG. 2), a test row address TRAD (FIG. 2), and a test column address TCAD (FIG. 2) when a write operation or a read operation is performed in the second test mode. The semiconductor device 13 may include an input/output control circuit (I/O CNT) 123 that simultaneously inputs write data WD1 and WD2 (FIG. 3) with different phases that are generated from the input data DIN to the plurality of banks BK1 and BK2 (FIG. 3), respectively, when a write operation is performed in the second test mode. The semiconductor device 13 may include the input/output control circuit 123 that generates output data DOUT (FIG. 2) and inverted output data DOUTB (FIG. 2) by sensing and amplifying read data RD1 and RD2 (FIG. 3) with different phases that are simultaneously output from the plurality of banks BK1 and BK2 (FIG. 3) when a read operation is performed in the second test mode.

Figure 2:
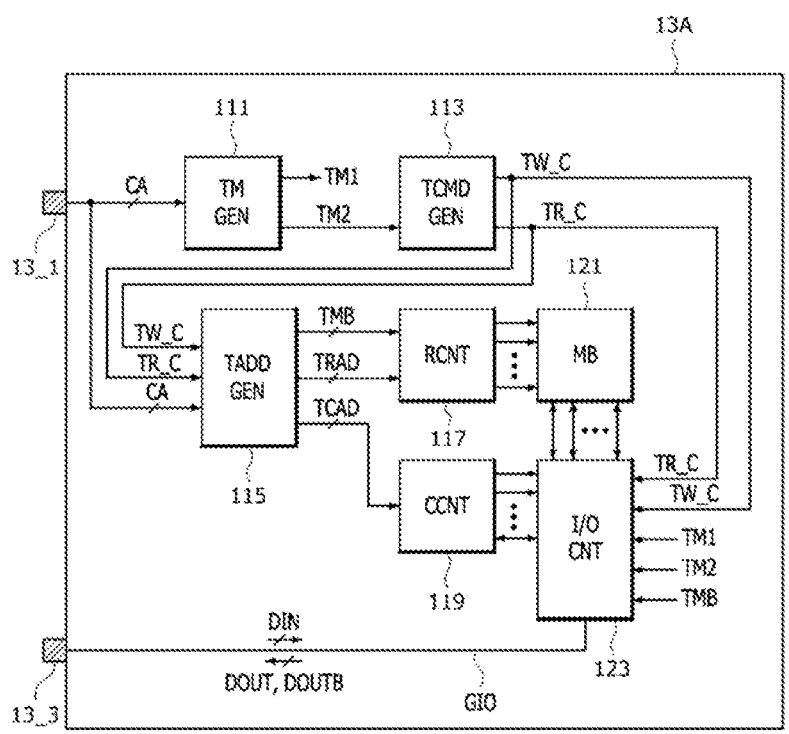
FIG. 2 is a block diagram illustrating a configuration of a semiconductor device according to an embodiment of the present disclosure.

FIG. 2 is a block diagram illustrating a configuration of a semiconductor device 13A according to an embodiment of the present disclosure. As illustrated in FIG. 2, the semiconductor device 13A may include a test mode signal generation circuit (TM GEN) 111, a test command generation circuit (TCMD GEN) 113, a test address generation circuit (TADD GEN) 115, a row control circuit (RCNT) 117, a column control circuit (CCNT) 119, a memory block (MB) 121, and an input/output control circuit (I/O CNT) 123.

The test mode signal generation circuit 111 may be connected to a first device pin 13_1, the test command generation circuit 113, and the input/output control circuit 123. The test mode signal generation circuit 111 may receive an external control signal CA from the first device pin 13_1. The test mode signal generation circuit 111 may generate a first test mode signal TM1 and a second test mode signal TM2 based on the external control signal CA. The test mode signal generation circuit 111 may apply the second test mode signal TM2 to the test command generation circuit 113. The test mode signal generation circuit 111 may apply the first test mode signal TM1 and the second test mode signal TM2 to the input/output control circuit 123. The first test mode signal TM1 may be activated to enter a first test mode. The first test mode may be entered in order to input the input data DIN that is inverted to each of the banks BK1 and BK2 (FIG. 3) that are included in the memory block 121. The second test mode signal TM2 may be activated in order to enter the second test mode. The second test mode may be entered in order to sequentially perform a write operation and a read operation on the plurality of banks BK1 and BK2 (FIG. 3) that are included in the memory block 121. In the second test mode, a write operation may be performed by simultaneously inputting data with different phases to the plurality of banks BK1 and BK2 (FIG. 3), respectively, included in the memory block 121. In the second test mode, a read operation may be performed by simultaneously outputting the data with different phases that are stored in each of the plurality of banks BK1 and BK2 (FIG. 3) that are included in the memory block 121. As an example, the test mode signal generation circuit 111 may generate the first test mode signal TM1 that is activated when the bits that are included in the external control signal CA are a first logic bit set, and may generate the second test mode signal TM2 that is activated when the bits that are included in the external control signal CA are a second logic bit set. The number of bits that are included in the external control signal CA, the first logic bit set, and the second logic bit set may be variously set according to embodiments.

The test command generation circuit 113 may be connected to the test mode signal generation circuit 111, the test address generation circuit 115, and the input/output control circuit 123. The test command generation circuit 113 may receive the second test mode signal TM2 from the test mode signal generation circuit 111. The test command generation circuit 113 may generate a test write command TW_C and a test read command TR_C based on the second test mode signal TM2. The test command generation circuit 113 may sequentially activate the test write command TW_C and the test read command TR_C in order to sequentially perform a write operation and a read operation on the plurality of banks BK1 and BK2 (FIG. 3) that are included in the memory block 121 when the second test mode signal TM2 is activated to enter the second test mode. In the second test mode, the test write command TW_C may be activated in order to simultaneously input data with different phases to each of the plurality of banks BK1 and BK2 (FIG. 3) that are included in the memory block 121. In the second test mode, the test read command TR_C may be activated in order to simultaneously output the data with different phases that are stored in each of the banks BK1 and BK2 of FIG. 3 that are included in the memory block 121. The test command generation circuit 113 may apply the test write command TW_C and the test read command TR_C to the test address generation circuit 115 and the input/output control circuit 123. In this embodiment, the test command generation circuit 113 may be set to generate the activated test write command TW_C and test read command TR_C once when the second test mode signal TM2 is activated, but is not limited thereto. In another embodiment, the test command generation circuit 113 may be set to generate the activated test write command TW_C and test read command TR_C twice or more when the second test mode signal TM2 is activated.

The test address generation circuit 115 may be connected to the first device pin 13_1, the test command generation circuit 113, the row control circuit 117, the column control circuit 119, and the input/output control circuit 123. The test address generation circuit 115 may receive the external control signal CA from the first device pin 13_1. The test address generation circuit 115 may receive the test write command TW_C and the test read command TR_C from the test command generation circuit 113. The test address generation circuit 115 may generate a test memory block address TMB, a test row address TRAD, and a test column address TCAD based on the external control signal CA, the test write command TW_C, and the test read command TR_C. The test address generation circuit 115 may apply the test memory block address TMB and the test row address TRAD to the row control circuit 117. The test address generation circuit 115 may apply the test column address TCAD to the column control circuit 119. The test address generation circuit 115 may apply the test memory block address TMB to the input/output control circuit 123.

The test address generation circuit 115 may generate the test memory block address TMB, the test column address TCAD, and the test row address TRAD in order to simultaneously input data with different phases to each of the plurality of banks BK1 and BK2 (FIG. 3) that are included in the memory block 121 when the test write command TW_C that is activated for a write operation in the second test mode is received. The test memory block address TMB may be activated in order to select the memory block 121 with the banks BK1 and BK2 (FIG. 3) on which the write operations are simultaneously performed in the second test mode. The test row address TRAD may be set such that bits with a logic bit set for selecting a word line (not shown) that is included in the banks BK1 and BK2 (FIG. 3) on which the write operations are simultaneously performed in the second test mode are included. The test column address TCAD may be set such that bits with a logic bit set for selecting a bit line (not shown) that is included in the banks BK1 and BK2 (FIG. 3) on which the write operations are simultaneously performed in the second test mode are included.

The test address generation circuit 115 may generate the test memory block address TMB, the test column address TCAD, and the test row address TRAD in order to simultaneously output the data with different phases that are stored in the plurality of banks BK1 and BK2 (FIG. 3) that are included in the memory block 121 when the test read command TR_C that is activated for a read operation in the second test mode is received. The test memory block address TMB may be activated in order to select the memory block 121 with the banks BK1 and BK2 (FIG. 3) on which the read operations are simultaneously performed in the second test mode. The test row address TRAD may be set such that bits with a logic bit set for selecting word lines (not shown) that are included in the banks BK1 and BK2 (FIG. 3) on which the read operations are simultaneously performed in the second test mode are included. The test column address TCAD may be set such that bits with a logic bit set for selecting bit lines (not shown) that are included in the banks BK1 and BK2 (FIG. 3) on which the read operations are simultaneously performed in the second test mode are included.

The row control circuit 117 may be connected to the test address generation circuit 115 and the memory block 121. The row control circuit 117 may receive the test memory block address TMB and the test row address TRAD from the test address generation circuit 115. The row control circuit 117 may select the memory block 121 with the banks BK1 and BK2 of FIG. 3 on which the write operations are simultaneously performed in the second test mode, based on the test memory block address TMB. Based on the test row address TRAD, the row control circuit 117 may select word lines (not shown) that are included in the banks BK1 and BK2 of FIG. 3 on which the write operations are simultaneously performed in the second test mode. Based on the test memory block address TMB, the row control circuit 117 may select the memory block 121 with the banks BK1 and BK2 of FIG. 3 on which the read operations are simultaneously performed in the second test mode. Based on the test row address TRAD, the row control circuit 117 may select word lines (not shown) that are included in the banks BK1 and BK2 of FIG. 3 on which the read operations are simultaneously performed in the second test mode.

The column control circuit 119 may be connected to the test address generation circuit 115 and the input/output control circuit 123. The column control circuit 119 may receive the test column address TCAD from the test address generation circuit 115. The column control circuit 119 may control the input/output control circuit 123 such that bit lines (not shown) that are included in the banks BK1 and BK2 of FIG. 3 on which the write operations are simultaneously performed in the second test mode are selected based on the test column address TCAD. Based on the test column address TCAD, the column control circuit 119 may control the input/output control circuit 123 such that bit lines that are included in the banks BK1 and BK2 of FIG. 3 on which the read operations are simultaneously performed in the second test mode are selected.

The memory block 121 may be connected to the row control circuit 117 and the input/output control circuit 123. The memory block 121 may include the banks BK1 and BK2 of FIG. 3 on which the read operations or write operations are simultaneously performed in the second test mode. The memory block 121 may be selected by the row control circuit 117 that receives the test memory block address TMB when the write operations or read operations are simultaneously performed in the second test mode. Although one memory block 121 is illustrated in this example, a plurality of memory blocks (121) may be implemented according to embodiments. The word lines (not shown) that are included in the banks BK1 and BK2 of FIG. 3 may be selected by the row control circuit 117 that receives the test row address TRAD when the write operations or read operations are simultaneously performed in the second test mode. The bit lines (not shown) that are included in the banks BK1 and BK2 of FIG. 3 may be selected by the column control circuit 119 and the input/output control circuit 123 that receive the test column address TCAD when the write operations or read operations are simultaneously performed in the second test mode.

The input/output control circuit 123 may be connected to the test mode signal generation circuit 111, the test command generation circuit 113, the test address generation circuit 115, the column control circuit 119, the memory block 121, and a global input/output line GIO. The input/output control circuit 123 may receive the first test mode signal TM1 and the second test mode signal TM2 from the test mode signal generation circuit 111. The input/output control circuit 123 may receive the test write command TW_C and the test read command TR_C from the test command generation circuit 113. The input/output control circuit 123 may receive the test memory block address TMB from the test address generation circuit 115. When a write operation is performed in the second test mode, the input/output control circuit 123 may generate write data WD1 and WD2 (FIG. 3) with different phases from the input data DIN that is received through the global input/output line GIO. When a write operation is performed in the second test mode, the input/output control circuit 123 may simultaneously input the write data WD1 and WD2 (FIG. 3) with different phases that are generated from the input data DIN to the plurality of banks BK1 and BK2 (FIG. 3), respectively. When a read operation is performed in the second test mode, the input/output control circuit 123 may sense and amplify the read data RD1 and RD2 of FIG. 3 with different phases that are simultaneously output from the plurality of banks BK1 and BK2 of FIG. 3 to generate output data DOUT and inverted output data DOUTB. The input/output control circuit 123 may output the output data DOUT and the inverted output data DOUTB to the second device pin 13_3 through the global input/output line GIO.

Figure 3:
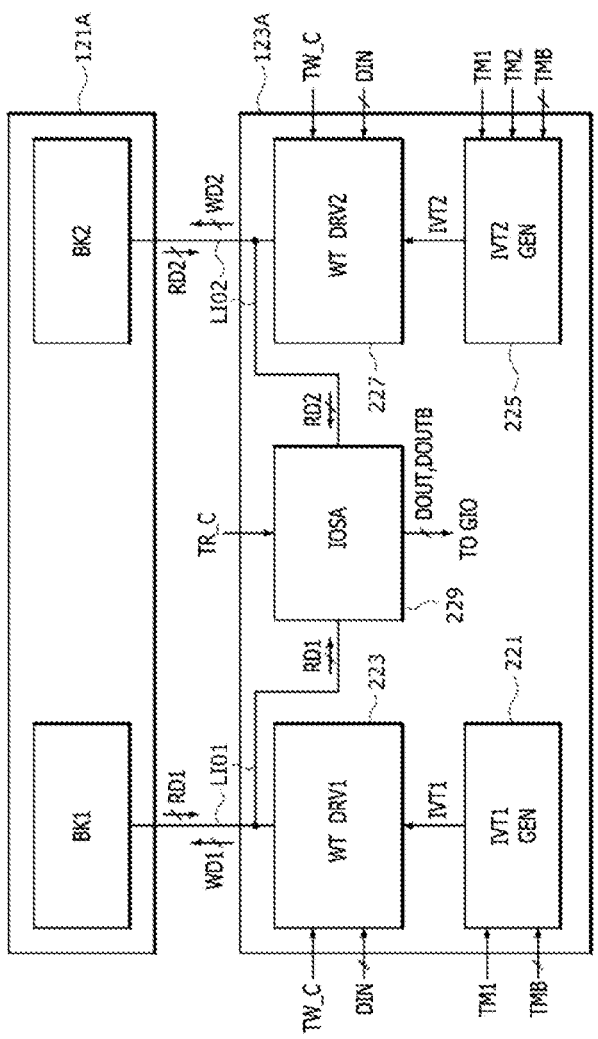
FIG. 3 is a block diagram illustrating a configuration of a memory block and an input/output control circuit according to an embodiment of the present disclosure.

FIG. 3 is a block diagram illustrating a configuration of a memory block 121A and an input/output control circuit 123A according to an embodiment of the present disclosure.

As illustrated (FIG. 3), the memory block 121A may include a first bank BK1 and a second bank BK2. The first bank BK1 may receive and store first write data WD1 when a write operation is performed in a second test mode. In this embodiment, the first write data WD1 may be generated to have the same phase as input data DIN. The second bank BK2 may receive and store second write data WD2 when a write operation is performed in the second test mode. In this embodiment, the second write data WD2 may be generated to have a phase that is inverted from that of the input data DIN. The first bank BK1 may output the first write data WD1 stored when a write operation is performed in the second test mode as first read data RD1, prior to when a read operation is performed in the second test mode. The second bank BK2 may output the second write data WD2 stored when the write operation is performed in the second test mode as second read data RD2, prior to when the read operation is performed in the second test mode.

As illustrated in FIG. 3, the input/output control circuit 123A may include a first inverted control signal generation circuit (IVT1 GEN) 221, a first write driver (WT DRV1) 223, a second inverted control signal generation circuit (IVT2 GEN) 225, a second write driver (WT DRV2) 227, and an input/output line sense amplifier (IOSA) 229.

The first inverted control signal generation circuit 221 may be connected to the first write driver 223. The first inverted control signal generation circuit 221 may generate first inverted control signal IVT1 based on a first test mode signal TM1 and a test memory block address TMB. The first inverted control signal generation circuit 221 may generate the first inverted control signal IVT1 that is activated to invert input data DIN when the test memory block address TMB is activated in the state of entering a first test mode. The first inverted control signal generation circuit 221 may generate the first inverted control signal IVT1 that is deactivated when the first test mode is not entered or when the test memory block address TMB is deactivated. The first inverted control signal generation circuit 221 may generate the first inverted control signal IVT1 that is deactivated when entering the second test mode.

The first write driver 223 may be connected to the first bank BK1 through a first local input/output line LIO1. The first write driver 223 may be connected to the first inverted control signal generation circuit 221. The first write driver 223 may receive the first inverted control signal IVT1 from the first inverted control signal generation circuit 221. Based on a test write command TW_C and the first inverted control signal IVT1, the first write driver 223 may generate first write data WD1 from the input data DIN. The first write driver 223 may receive the activated test write command TW_C and the deactivated first inverted control signal IVT1 when a write operation on the first bank BK1 is performed in the second test mode. The first write driver 223 may buffer the input data DIN to generate the first write data WD1 when the write operation on the first bank BK1 is performed in the second test mode. The write data WD1 may be generated to have the same phase as the input data DIN.

The second inverted control signal generation circuit 225 may be connected to the second write driver 227. The second inverted control signal generation circuit 225 may generate a second inverted control signal IVT2 based on the first test mode signal TM1, the second test mode signal TM2, and the test memory block address TMB. The second inverted control signal generation circuit 225 may generate the second inverted control signal IVT2 that is activated in order to invert the input data DIN when the test memory block address TMB is activated in the state of entering the first test mode. The second inverted control signal generation circuit 225 may generate the second inverted control signal IVT2 that is activated in order to invert the input data DIN when the test memory block address TMB is activated in the state of entering the second test mode. The second inverted control signal generation circuit 225 may generate the second inverted control signal IVT2 that is deactivated when the first test mode and the second test mode are not entered or when the test memory block address TMB is deactivated.

The second write driver 227 may be connected to the second bank BK2 through a second local input/output line LIO2. The second write driver 227 may be connected to the second inverted control signal generation circuit 225. The second write driver 227 may receive the second inverted control signal IVT2 from the second inverted control signal generation circuit 225. Based on the test write command TW_C and the second inverted control signal IVT2, the second write driver 227 may generate second write data WD2 from the input data DIN. The second write driver 227 may receive the activated test write command TW_C and the activated second inverted control signal IVT2 when a write operation on the second bank BK2 is performed in the second test mode. The second write driver 227 may generate second write data WD2 by inversely buffering the input data DIN when the write operation is performed on the second bank BK2 in the second test mode. The second write data WD2 may be generated to have a phase that is inverted from that of the input data DIN.

The input/output line sense amplifier 229 may be connected to the first bank BK1 through the first local input/output line LIO1 and may be connected to the second bank BK2 through the second local input/output line LIO2. The input/output line sense amplifier 229 may receive first read data RD1 from the first bank BK1 through the first local input/output line LIO1 and may receive second read data RD2 from the second bank BK2 through the second local input/output line LIO2 when a read operation is performed in the second test mode and an activated test read command TR_C is received. The input/output line sense amplifier 229 may sense and amplify the first read data RD1 and the second read data RD2 to generate an output data DOUT and an inverted output data DOUTB when the read operation is performed in the second test mode. The input/output line sense amplifier 229 may output the output data DOUT and the inverted output data DOUTB through the global input/output line GIO.

Figure 4:
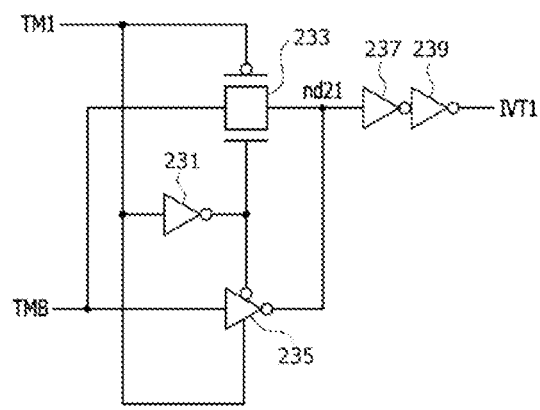
FIG. 4 is a circuit diagram illustrating a first inverted control signal generation circuit according to an embodiment of the present disclosure.

FIG. 4 is a circuit diagram illustrating a first inverted control signal generation circuit 221A according to an embodiment of the present disclosure. As illustrated in FIG. 4, the first inverted control signal generation circuit 221A may include inverters 231, 235, 237, and 239, and a transfer gate 233. The inverter 231 may inversely buffer a first test mode signal TM1 to output an inversely buffered signal of the first test mode signal TM1. The transfer gate 233 may transfer a test memory block address TMB to a node nd21 when the first test mode signal TM1, which is deactivated to a logic "low" level by not entering the first test mode, is input. The inverter 235 may inversely buffer the test memory block address TMB to output an inversely buffered signal of the test memory block address TMB to the node nd21 when the first test mode signal TM1, which is activated to a logic "high" level by entering the first test mode, is input. The inverters 237 and 239 may buffer the signal of the node nd21 to output a first inverted control signal IVT1. The first inverted control signal generation circuit 221A may generate the first inverted control signal IVT1 activated to a logic "high" level when the first test mode signal TM1, which is activated to a logic "high" level by entering the first test mode, is input, and the test memory block address TMB is activated to a logic "low" level. The first inverted control signal generation circuit 221A may generate the first inverted control signal IVT1 that is deactivated to a logic "low" level when the first test mode signal TM1, which is deactivated to a logic "low" level by entering the first test mode, is input, and the test memory block address TMB is activated to a logic "low" level. In this embodiment, the first test mode signal TM1 and the first inverted control signal IVT1 are activated to a logic "high" level, and the test memory block address TMB is activated to a logic "low" level, but this is merely an example. The present disclosure is not limited thereto.

Figure 5:
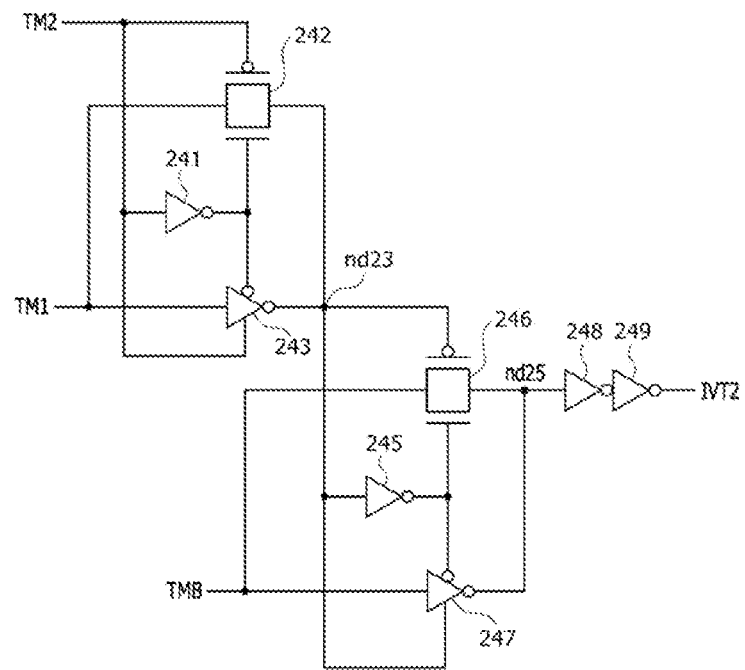
FIG. 5 is a circuit diagram illustrating a second inverted control signal generation circuit according to an embodiment of the present disclosure.

FIG. 5 is a circuit diagram illustrating a second inverted control signal generation circuit 225A according to an embodiment of the present disclosure. As illustrated in FIG. 5, the second inverted control signal generation circuit 225A may include inverters 241, 243, 245, 247, 248, and 249 and transfer gates 242 and 246. The inverter 241 may inversely buffer a second test mode signal TM2 to output an inversely buffered signal of the second test mode signal TM2. The transfer gate 242 may transfer a first test mode signal TM1 that is deactivated to a logic "low" level to a node nd23 when the second test mode signal TM2, which is deactivated to a logic "low" level by not entering the first test mode and the second test mode, is input. The transfer gate 242 may transfer the first test mode signal TM1 that is activated to a logic "high" level to the node nd23 when the second test mode signal TM2, which is deactivated to a logic "low" level by entering the first test mode, is input. The inverter 243 may inversely buffer the first test mode signal TM1 that is deactivated to a logic "low" level to output an inversely buffered signal of the first test mode signal TM1 to the node nd23 when the second test mode signal TM2, which is activated to a logic "high" level by entering the second test mode, is input. The inverter 245 may inversely buffer a signal of the node nd23 to output an inversely buffered signal. The transfer gate 246 may transfer the test memory block address TMB to a node nd25 when the signal of the node nd23 is generated to a logic "low" level by not entering the first test mode and the second test mode. The inverter 235 may inversely buffer the test memory block address TMB to transfer an inversely buffered signal of the test memory block address TMB to the node nd25 when the signal of the node nd23 is generated at a logic "high" level by entering the first test mode. The inverter 235 may inversely buffer the test memory block address TMB to output an inversely buffered signal of the test memory block address TMB to the node nd25 when the signal of the node nd23 is generated at a logic "high" level by entering the second test mode. The inverters 248 and 249 may buffer the signal of the node nd25 to generate the second inverted control signal IVT2. The second inverted control signal generation circuit 225A may generate the second inverted control signal IVT2 that is activated to a logic "high" level when the first test mode signal TM1 that is activated to a logic "high" level and a second test mode signal TM2 that is deactivated to a logic "low" level are input by entering the first test mode and the test memory block address TMB is activated to a logic "low" level. The second inverted control signal generation circuit 225A may generate the second inverted control signal IVT2 that is activated to a logic "high" level when the first test mode signal TM1 that is deactivated to a logic "low" level and the second test mode signal TM2 that is activated to a logic "high" level are input by entering the second test mode and the test memory block address TMB is activated to a logic "low" level. In this embodiment, although the first test mode signal TM1, the second test mode signal TM2, and the second inverted control signal IVT2 are activated to a logic "high" level and the test memory block address TMB is activated to a logic "low" level, this is merely an example and the present disclosure is not limited thereto.

Figure 6:
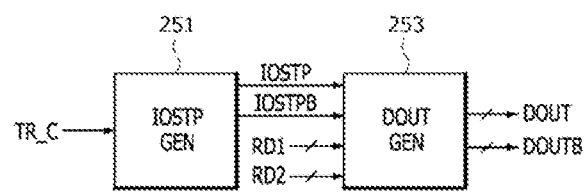
FIG. 6 is a block diagram illustrating a configuration of an input/output line sense amplifier according to an embodiment of the present disclosure.

FIG. 6 is a block diagram illustrating a configuration of an input/output line sense amplifier 229A according to an embodiment of the present disclosure. As illustrated in FIG. 6, the input/output line sense amplifier 229A may include an input/output strobing pulse generation circuit 251 and an output data generation circuit 253.

The input/output strobing pulse generation circuit 251 may be connected to the output data generation circuit 253. Based on a test read command TR_C, the input/output strobing pulse generation circuit 251 may generate an input/output strobing pulse IOSTP and an inverted input/output strobing pulse IOSTPB. The input/output strobing pulse generation circuit 251 may generate an input/output strobing pulse IOSTP that is activated to a logic "high" level and an inverted input/output strobing pulse IOSTPB that is activated to a logic "low" level when a read operation is performed in a second test mode and a test read command TR_C that is activated to a logic "high" level is received. The input/output strobing pulse generation circuit 251 may apply the input/output strobing pulse IOSTP and the inverted input/output strobing pulse IOSTPB to the output data generation circuit 253. In this embodiment, although the input/output strobing pulse IOSTP is activated to a logic "high" level and the inverted input/output strobing pulse IOSTPB is activated to a logic "low" level, this is merely an example and the present disclosure is not limited thereto.

The output data generation circuit 253 may be connected to the input/output strobing pulse generation circuit 251. The output data generation circuit 253 may receive the input/output strobing pulse IOSTP and the inverted input/output strobing pulse IOSTPB from the input/output strobing pulse generation circuit 251. Based on the input/output strobing pulse IOSTP and the inverted input/output strobing pulse IOSTPB, the output data generation circuit 253 may sense and amplify a first read data RD1 and a second read data RD2 to generate output data DOUT and an inverted output data DOUTB.

Figure 7:
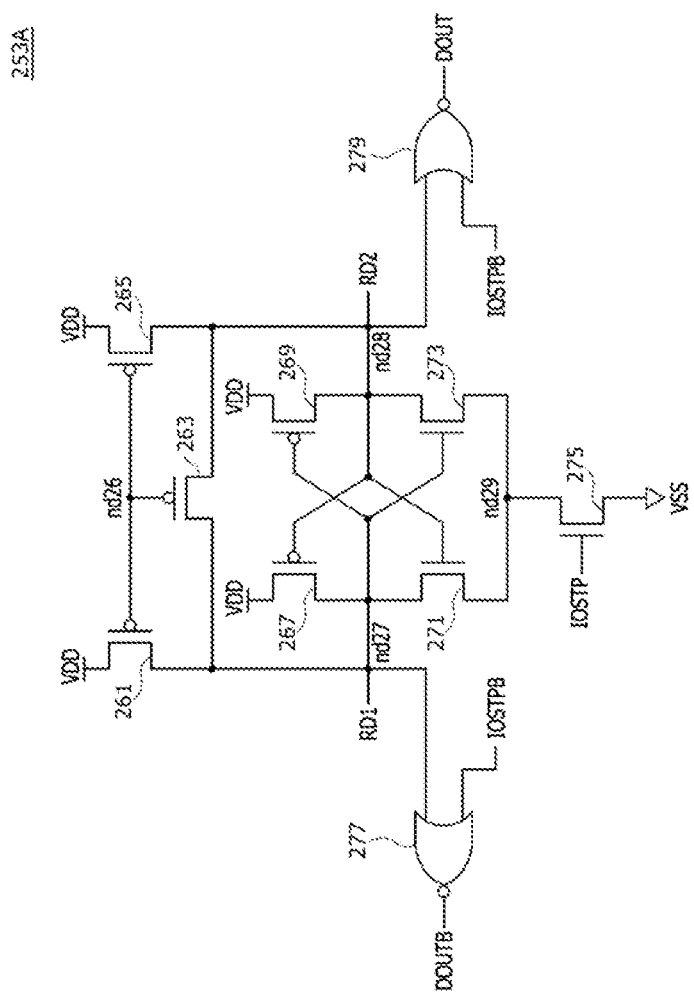
FIG. 7 is a circuit diagram illustrating an output data generation circuit according to an embodiment of the present disclosure.

FIG. 7 is a circuit diagram illustrating an input/output data generation circuit 253A according to an embodiment of the present disclosure. As illustrated in FIG. 7, the input/output data generation circuit 253A may include PMOS transistors 261, 263, 265, 267, and 269, NMOS transistors 271, 273, and 275, and NOR gates 277 and 279. The PMOS transistor 261 may be connected between a power supply voltage terminal VDD and a node nd27, and the PMOS transistor 261 may be turned on based on a signal of a node nd26. The PMOS transistor 263 may be connected between the node nd27 and a node nd28, and the PMOS transistor 263 may be turned on based on a signal of the node nd26. The PMOS transistor 265 may be connected between the power supply voltage terminal VDD and the node nd28, and the PMOS transistor 265 may be turned on based on the signal of the node nd26. The PMOS transistor 267 may be connected between the power supply voltage terminal VDD and the node nd27, and the PMOS transistor 267 may be turned on based on a signal of the node nd28. The PMOS transistor 269 may be connected between the power supply voltage terminal VDD and the node nd28, and the PMOS transistor 269 may be turned on based on a signal of the node nd27. The NMOS transistor 271 may be connected between the node nd27 and a node nd29, and the NMOS transistor 271 may be turned on based on the signal of the node nd28. The NMOS transistor 273 may be connected between the node nd28 and the node nd29, and the NMOS transistor 273 may be turned on based on the signal of the node nD27. The NMOS transistor 275 may be connected between the node nd29 and a ground voltage terminal VSS, and the NMOS transistor 275 may be turned on based on the input/output strobing pulse IOSTP. The NOR gate 277 may receive the inverted input/output strobing pulse IOSTPB and the signal of the node nd27, and the NOR gate 277 may perform an NOR operation to generate the inverted output data DOUTB. The NOR gate 279 may receive the inverted input/output strobing pulse IOSTPB and the signal of the node nd28, and the NOR gate 279 may perform an NOR operation to generate output data DOUT. The output data generation circuit 253A may sense and amplify the first read data RD1 and the second read data RD2 to generate the output data DOUT and the inverted output data DOUTB when the read operation is performed in the second test mode.

FIGS. 8 to 16 are diagrams illustrating an operation of a semiconductor device 13A according to an embodiment of the present disclosure when the semiconductor device 13A enters a second test mode.

Figure 8:
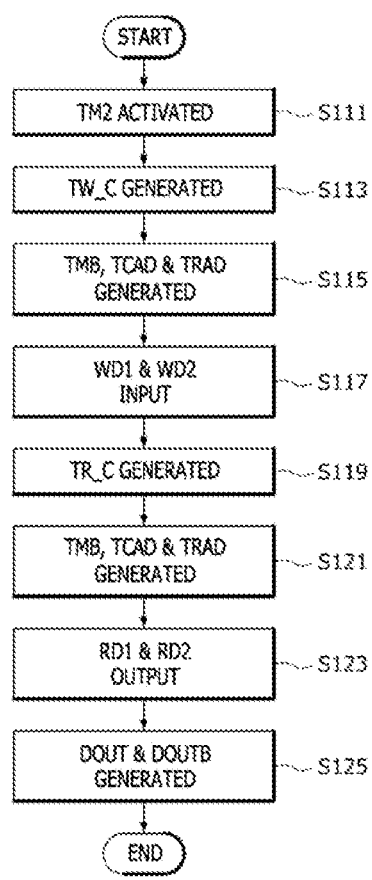
FIGS. 8 to 16 are diagrams illustrating an operation of a semiconductor device according to an embodiment of the present disclosure when the semiconductor device enters a second test mode.
Figure 9:
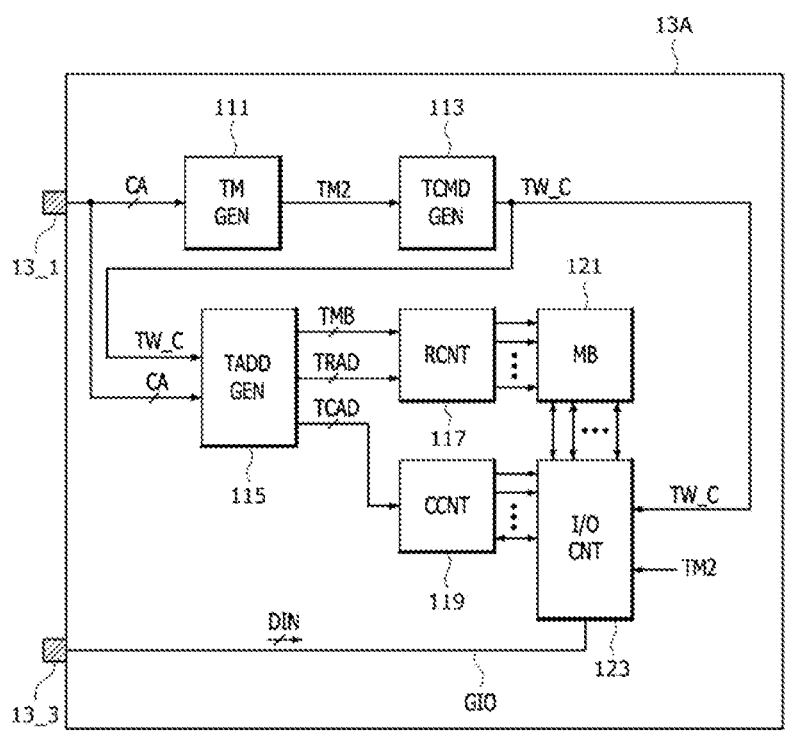

As illustrated in FIGS. 8 and 9, a test mode signal generation circuit 111 may decode an external control signal CA to generate a second test mode signal TM2 that is activated to enter a second test mode (S111). A test command generation circuit 113 may generate a test write command TW_C that is activated to perform a write operation in the second test mode (S113). A test address generation circuit 115 may generate a test memory block address TMB, a test column address TCAD, and a test row address TRAD for the write operation in the second test mode (S115). An input/output control circuit 123 may control a memory block 121 such that first write data WD1 and second write data WD2 that are generated in phases that are inverted from each other are input to a first bank BK1 and a second bank BK2 that are accessed by the test memory block address TMB, the test column address TCAD, and the test row address TRAD (S117).

Figure 10:
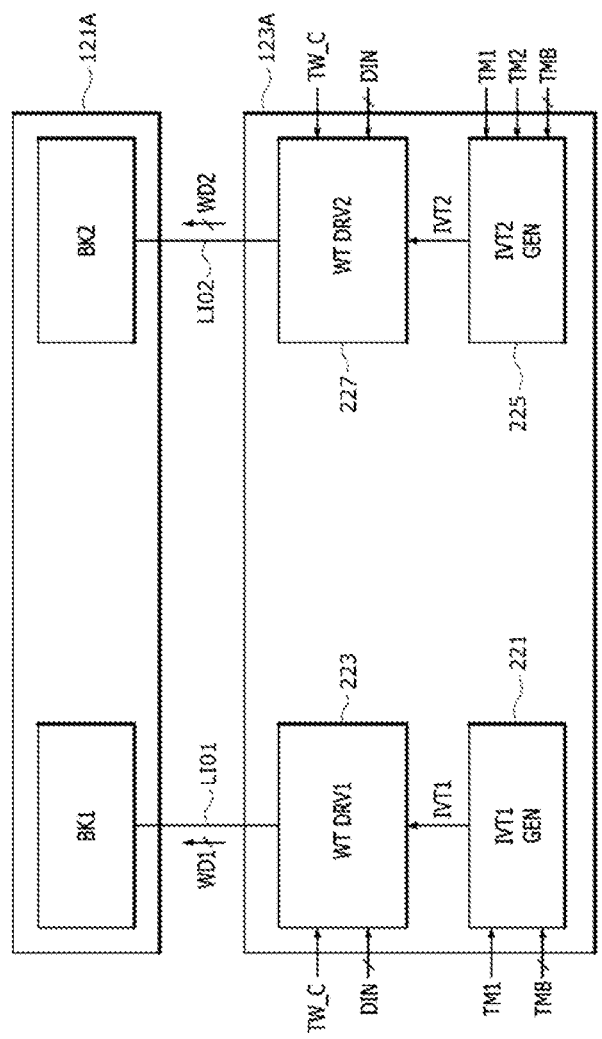
Figure 11:
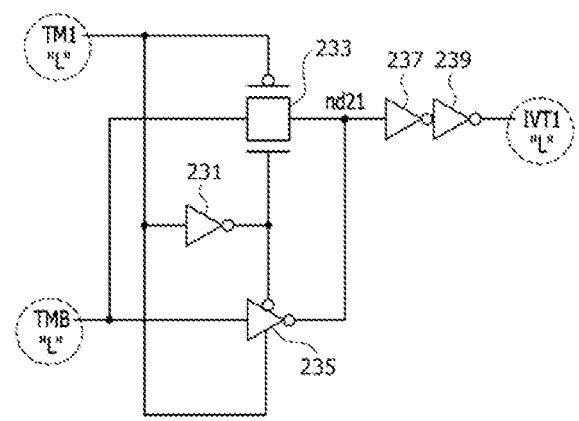

As illustrated in FIGS. 10 and 11, when a write operation is performed in the second test mode, a first inverted control signal generation circuit 221A may receive the first test mode signal TM1 that is deactivated to a logic "low" level and the test memory block address TMB that is activated to a logic "low" level to generate a first inverted control signal IVT1 that is deactivated to a logic "low" level. When the write operation is performed in the second test mode, a first write driver 223 may receive the first inverted control signal IVT1 that is deactivated to a logic "low" level to generate the first write data WD1 with the same phase as input data DIN. A first bank BK1 may receive and store the first write data WD1 through a first local input/output line LIO1.

Figure 12:
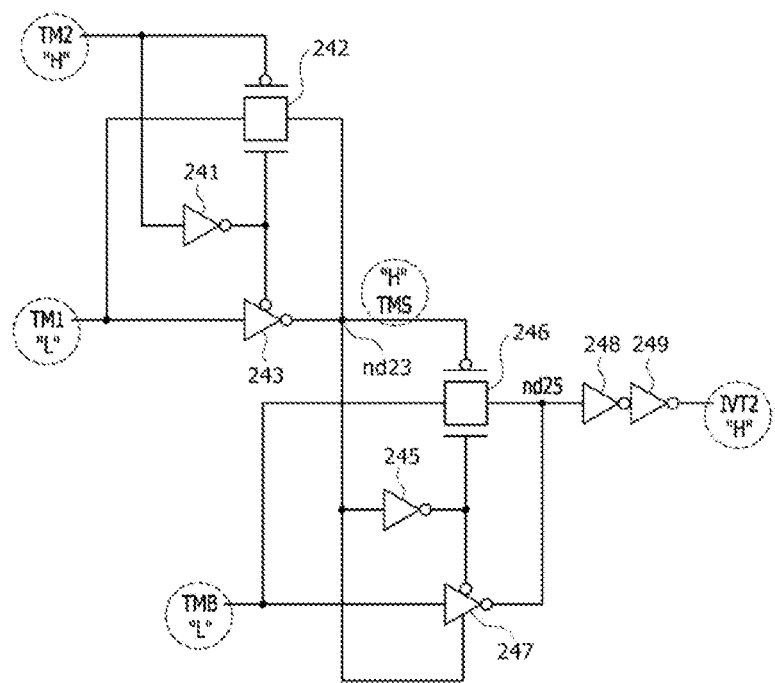

As illustrated in FIGS. 10 and 12, when the write operation is performed in the second test mode, a second inverted control signal generation circuit 225A may receive the first test mode signal TM1 that is deactivated to a logic "low" level, the second test mode signal TM2 that is activated to a logic "high" level, and the test memory block address TMB that is activated to a logic "low" level to generate a second inverted control signal IVT2 that is activated to a logic "high" level. When the write operation is performed in the second test mode, a second write driver 227 may receive the second inverted control signal IVT2 that is activated to a logic "high" level to generate the second write data WD2 with a phase that is inverted from that of the input data DIN. A second bank BK2 may receive and store the second write data WD2 through a second local input/output line LIO2.

Figure 13:
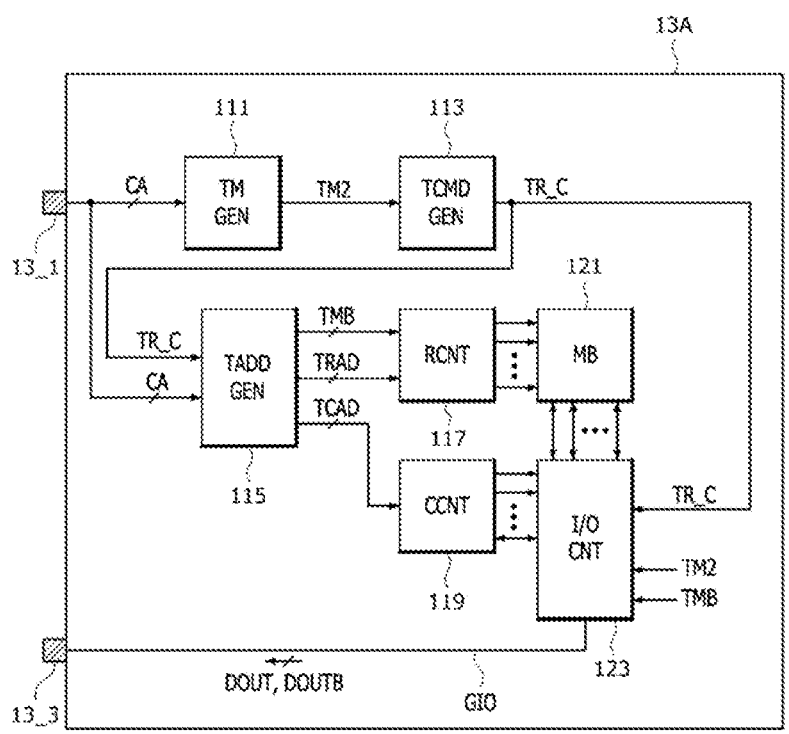

As illustrated in FIGS. 8 and 13, the test command generation circuit 113 may generate a test read command TR_C that is activated to perform a read operation in the second test mode (S119). The test address generation circuit 115 may generate the test memory block address TMB, the test column address TCAD, and the test row address TRAD for the read operation in the second test mode (S121). The input/output control circuit 123 may control the memory block 121 such that first read data RD1 and second read data RD2, the first read data RD1 having a different phase compared to that of the second read data RD2, are output from the first bank BK1 and the second bank BK2, respectively, accessed by the test memory block address TMB, the test column address TCAD, and the test row address TRAD (S123). The input/output control circuit 123 may sense and amplify the first read data RD1 and the second read data RD2 to generate the output data DOUT and the inverted output data DOUTB (S125).

Figure 14:
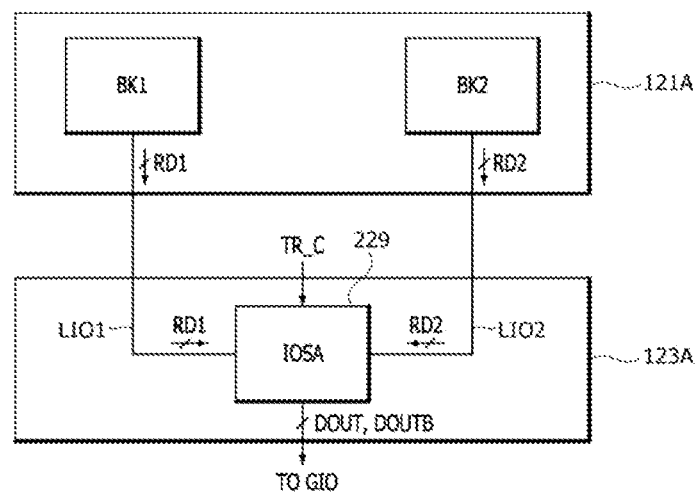

As illustrated in FIG. 14, when a read operation is performed in the second test mode, the first read data RD1 and the second read data RD2 with different phases may be output from the first bank BK1 and the second bank BK2, respectively, included in the memory block 121A. When the read operation is performed in the second test mode, an input/output line sense amplifier 229 that is included in the input/output control circuit 123A may receive the first read data RD1 from the first bank BK1 through a first local input/output line LIO1 and may receive the second read data RD2 from the second bank BK2 through a second local input/output line LIO2. The input/output line sense amplifier 229 may sense and amplify the first read data RD1 and the second read data RD2 to generate the output data DOUT and the inverted output data DOUTB. The input/output line sense amplifier 229 may output the output data DOUT and the inverted output data DOUTB through the global input/output line GIO.

Figure 15:
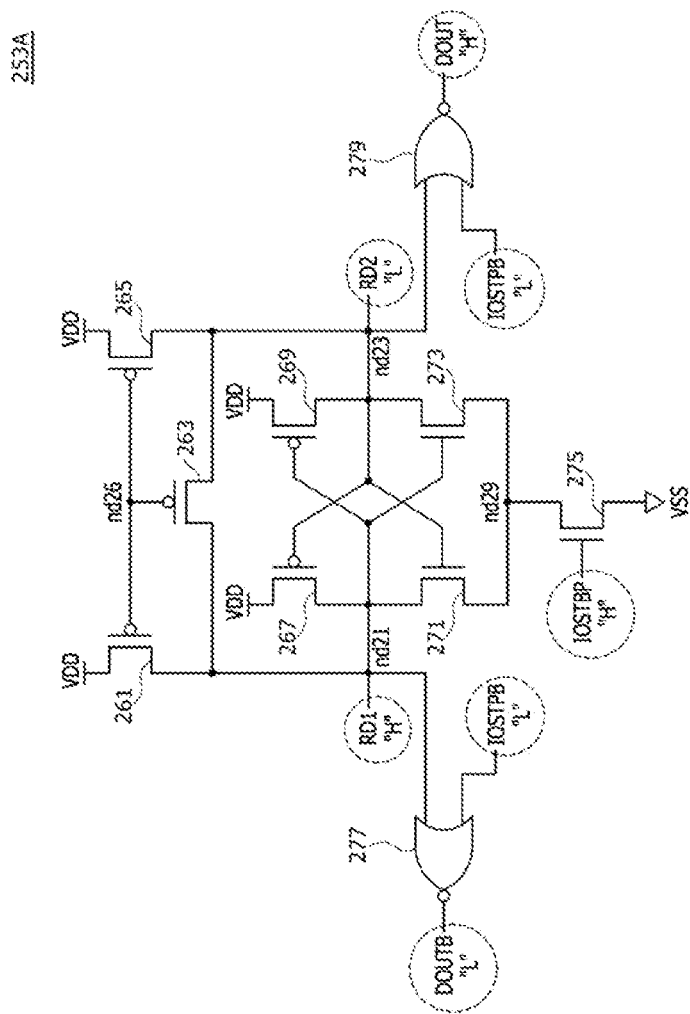

As illustrated in FIG. 15, in a state in which a read operation is performed in the second test mode and an input/output strobing pulse IOSTP that is activated to a logic "high" level "H" and an inverted input/output strobing pulse IOSTPB that is activated to a logic "low" level "L" are generated, when the first read data RD1 of a logic "high" level "H" and the second read data RD2 of a logic "low" level "L" are received, a node nd21 may be driven by a power supply voltage terminal VDD through a PMOS transistor 267, and a node nd23 may be driven by a ground voltage terminal VSS through NMOS transistors 273 and 275. A NOR gate 277 may inversely buffer the sensed and amplified signal of the node nd21 to generate the inverted output data DOUTB of a logic "low" level "L". A NOR gate 279 may inversely buffer the sensed and amplified signal of the node nd23 to generate the output data DOUT of a logic "high" level "H".

Figure 16:
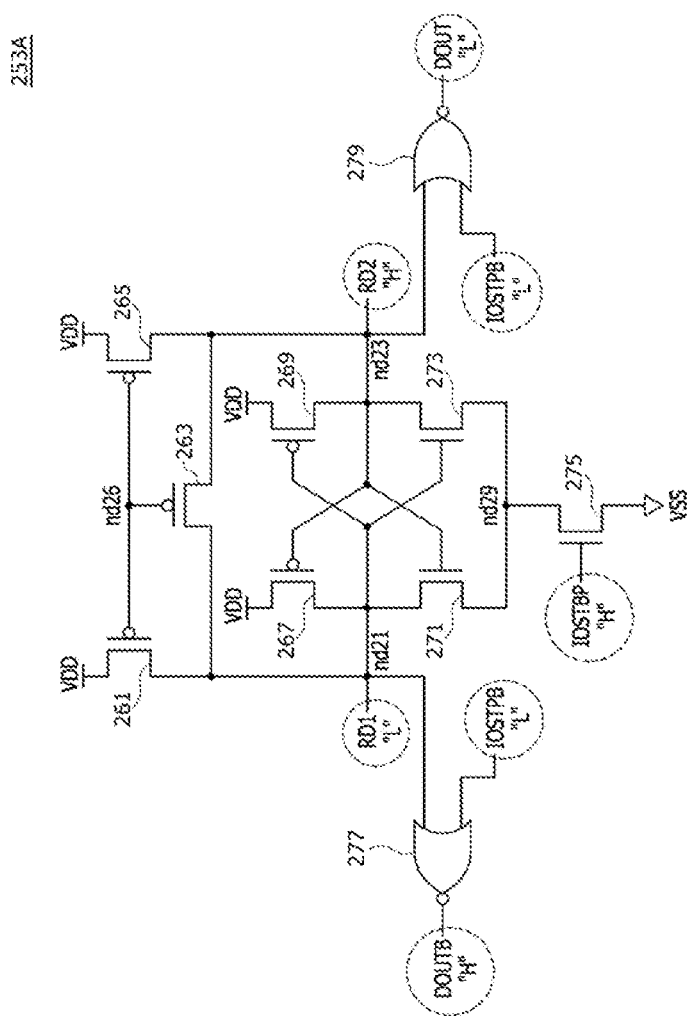

As illustrated in FIG. 16, in a state in which a read operation is performed in the second test mode and an input/output strobing pulse IOSTP that is activated to a logic "high" level "H" and an inverted input/output strobing pulse IOSTPB that is activated to a logic "low" level "L" are generated, when the first read data RD1 of a logic "low" level "L" and the second read data RD2 of a logic "high" level "H" are received, the node nd21 may be driven by the ground voltage terminal VSS through the NMOS transistors 271 and 275, and the node nd23 may be driven by the power supply voltage terminal VDD through the PMOS transistor 269. The NOR gate 277 may inversely buffer the sensed and amplified signal of the node nd21 to generate the inverted output data DOUTB of a logic "high" level "H". The NOR gate 279 may inversely buffer the sensed and amplified signal of the node nd23 to generate the output data DOUT of the logic "low" level "L".

As described above, the semiconductor device 13A, according to an embodiment of the present disclosure, may simultaneously perform a write operation of inputting the first write data WD1 and the second write data WD2 with different phases to the first bank BK1 and the second bank BK2, respectively, included in the memory block 121. In addition, the semiconductor device 13A, according to an embodiment of the present disclosure, may simultaneously perform a read operation of outputting the first read data RD1 and the second read data RD2 with different phases from the first bank BK1 and the second bank BK2, respectively. Therefore, according to the semiconductor device 13A, the operation in the second test mode for checking whether the write operation and the read operation are performing normally can be performed quickly by simultaneously performing the write operation and the read operation on the first bank BK1 and the second bank BK2. The controller 11, according to an embodiment of the present disclosure, may check whether the output data DOUT and the inverted output data DOUT that is generated by the semiconductor device 13A have different phases so that it can be checked whether the write operation and the read operation in the second test mode are performing normally.

Figure 17:
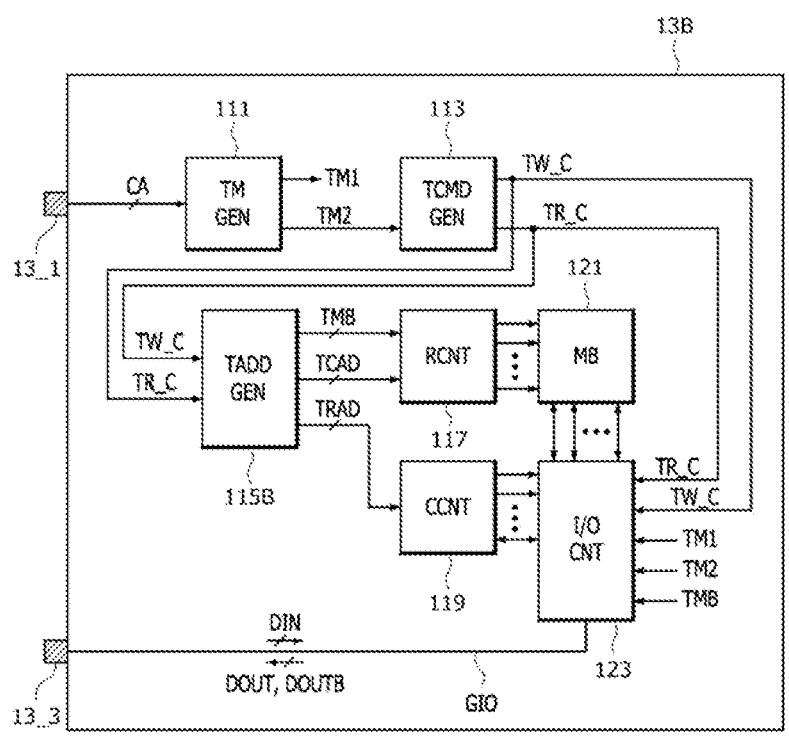
FIG. 17 is a block diagram illustrating a configuration of a semiconductor device according to another embodiment of the present disclosure.

FIG. 17 is a block diagram illustrating a configuration of a semiconductor device 13B according to another embodiment of the present disclosure. As illustrated in FIG. 17, the semiconductor device 13B may include a test mode signal generation circuit (TM GEN) 111, a test command generation circuit (TCMD GEN) 113, a test address generation circuit (TADD GEN) 115B, a row control circuit (RCNT) 117, a column control circuit (CCNT) 119, a memory block (MB) 121, and an input/output control circuit (I/O CNT) 123.

The test address generation circuit 115B may be connected to the test command generation circuit 113, the row control circuit 117, the column control circuit 119, and the input/output control circuit 123. The test address generation circuit 115B may receive a test write command TW_C and a test read command TR_C from the test command generation circuit 113. The test address generation circuit 115B may generate a test memory block address TMB, a test row address TRAD, and a test column address TCAD based on the test write command TW_C and the test read command TR_C. The test address generation circuit 115B may apply the test memory block address TMB and the test row address TRAD to the row control circuit 117. The test address generation circuit 115B may apply the test column address TCAD to the column control circuit 119. The test address generation circuit 115B may apply the test memory block address TMB to the input/output control circuit 123.

The semiconductor device 13B may be implemented in the same manner as the semiconductor device 13A, illustrated in FIG. 2, except that the test address generation circuit 115B generates the test memory block address TMB, the test row address TRAD, and the test column address TCAD regardless of the external control signal CA. Accordingly, since the configurations of the test mode signal generation circuit 111, the test command generation circuit 113, the row control circuit 117, the column control circuit 119, the memory block 121, and the input/output control circuit 123 that are included in the semiconductor device 13B are the same as the configurations of the test mode signal generation circuit 111, the test command generation circuit 113, the row control circuit 117, the column control circuit 119, the memory block 121, and the input/output control circuit 123 that are included in the semiconductor device 13A, illustrated in FIG. 2, a detailed description for the configurations and operations will be omitted.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:
1. A semiconductor device comprising:
   a test command generation circuit that generates a test write command and a test read command when entering a test mode; and
   an input/output control circuit comprising:

a first inverted control signal generation circuit that generates a first inverted control signal that is deactivated in the test mode; and a second inverted control signal generation circuit that generates a second inverted control signal that is activated in the test mode, wherein the input/output control circuit controls a memory block, the memory block including a plurality of banks, such that write operations are simultaneously performed on the plurality of banks based on the test write command and read operations are simultaneously performed on the plurality of banks based on the test read command.

2. The semiconductor device of claim 1, wherein the input/output control circuit comprises:

a first write driver that generates first write data from an input data based on the test write command; and a second write driver that generates second write data from the input data based on the test write command.

3. The semiconductor device of claim 2, wherein the memory block includes a first bank and a second bank, and wherein the input/output control circuit applies the first write data to the first bank and applies the second write data to the second bank.

4. The semiconductor device of claim 2, wherein the input/output control circuit generates the first write data and the second write data, the first write data being set to a different phase compared to that of the second write data.

5. The semiconductor device of claim 1, wherein, based on the first inverted control signal, the first write driver buffers the input data to generate the first write data, and wherein, based on the second inverted control signal, the second write driver buffers the input data to generate the second write data.

6. The semiconductor device of claim 1, wherein, based on a first test mode signal, the first inverted control signal generation circuit buffers or inversely buffers a test memory block address to generate the first inverted control signal.

7. The semiconductor device of claim 1, wherein, based on a first test mode signal and a second test mode signal, the second inverted control signal generation circuit buffers or inversely buffers a test memory block address to generate the second inverted control signal.

8. The semiconductor device of claim 1, wherein the input/output control circuit comprises an input/output line sense amplifier that, based on the test read command, senses and amplifies first read data and second read data to generate output data.

9. The semiconductor device of claim 8, wherein the memory block includes a first bank and a second bank, and wherein the input/output line sense amplifier receives the first read data that is output from the first bank and receives the second read data that is output from the second bank.

10. The semiconductor device of claim 8, wherein the input/output line sense amplifier comprises:

an input/output strobing pulse generation circuit that generates an input/output strobing pulse based on the test read command; and an output data generation circuit that, based on the input/output strobing pulse, senses and amplifies the first read data and the second read data to generate the output data.

11. The semiconductor device of claim 1, further comprising a test mode signal generation circuit that decodes an external control signal to generate a test mode signal that is activated to enter the test mode.

12. The semiconductor device of claim 1, further comprising a test address generation circuit that, based on the test write command and the test read command, generates a test memory block address, a test row address, and a test column address from a external control signal.

13. The semiconductor device of claim 12, further comprising:

a row control circuit that, based on the test memory block address and the test row address, selects a word line that is included in the plurality of banks; and a column control circuit that, based on the test column address, controls the input/output control circuit for selecting a bit line that is included in the plurality of banks.

14. The semiconductor device of claim 1, further comprising a test address generation circuit that, based on the test write command and the test read command, generates a test memory block address, the test row address, and a test column address.

* * * * *